United States Patent
Zheng et al.

(10) Patent No.: US 9,798,364 B2
(45) Date of Patent: Oct. 24, 2017

(54) CHASSIS USED FOR AN ELECTRONIC DEVICE

(71) Applicant: EATON MANUFACTURING LP, GLASGOW, SUCCURSALE DE MORGES, Morges (CH)

(72) Inventors: Leo Zheng, Shenzhen (CN); Tango Tang, Shenzhen (CN); Min Yin, Shenzhen (CN); Cheng Su, Shenzhen (CN)

(73) Assignee: Eaton Manufacturing LP, Glasgow Succursale De Morges (CH)

( * ) Notice: Subject to any disclaimer, the term of this patent is extended or adjusted under 35 U.S.C. 154(b) by 65 days.

(21) Appl. No.: 14/648,586

(22) PCT Filed: Nov. 15, 2013

(86) PCT No.: PCT/CN2013/087263
§ 371 (c)(1),
(2) Date: Oct. 23, 2015

(87) PCT Pub. No.: WO2014/082531
PCT Pub. Date: Jun. 5, 2014

(65) Prior Publication Data
US 2016/0034006 A1 Feb. 4, 2016

(30) Foreign Application Priority Data
Nov. 30, 2012 (CN) .......................... 2012 1 0505184

(51) Int. Cl.
*G06F 1/18* (2006.01)
*H05K 5/02* (2006.01)
*H05K 5/03* (2006.01)

(52) U.S. Cl.
CPC .............. *G06F 1/188* (2013.01); *G06F 1/181* (2013.01); *G06F 1/189* (2013.01); *H05K 5/0226* (2013.01); *H05K 5/0247* (2013.01); *H05K 5/03* (2013.01)

(58) Field of Classification Search
CPC .......... G06F 1/188; G06F 1/181; G06F 1/189; H05K 5/03; H05K 5/0247; H05K 5/0226
(Continued)

(56) References Cited

U.S. PATENT DOCUMENTS 5,646,820 A * 7/1997 Honda .................. G06F 1/1616
361/679.6
6,101,097 A * 8/2000 Foo ......................... G06F 1/184
312/223.1
(Continued)

FOREIGN PATENT DOCUMENTS

CN 101136500 A 3/2008
CN 201489426 * 7/2009 ............... G06F 1/18
(Continued)

OTHER PUBLICATIONS

International Search Report Corresponding to International Application No. PCT/CN2013/087263; dated Jan. 23, 2014; Foreign Text, 4 Pages, English Translation Thereof, 3 Pages.
(Continued)

*Primary Examiner* — Steven T Sawyer
*Assistant Examiner* — Sagar Shrestha
(74) *Attorney, Agent, or Firm* — Ward and Smith, P.A.

(57) ABSTRACT

A chassis used for an electronic device is disclosed, comprising: a main body (21) suitable for internally accommodating the electronic device, wherein the main body has an opening on at least one of its sides for accommodating the optional accessories of the electronic device; and a panel (22) for enclosing the opening when closed and exposing the
(Continued)

opening when opened. The panel (22) is suitable to be connected with a cable (23), the first end of which is suitable for being electrically connected to the electronic device and the second end of which is suitable for being electrically connected to the optional accessories. The panel (22) maintains the cable (23) within the main body (21) when closed, and exposes the second end of the cable (23) when opened. According to an embodiment of the present invention, A UPS arranged inside the chassis described above is provided. A set of SNMP optional accessories are also provided for the UPS, which may be installed only when SNMP function is needed, so that the manufacture cost of the UPS is reduced.

12 Claims, 7 Drawing Sheets

(58) Field of Classification Search
USPC ......... 361/724–727, 679.02, 679.32–679.39; 312/223.1–223.3, 223.6
See application file for complete search history.

(56) References Cited

U.S. PATENT DOCUMENTS

| | | | | |
|---|---|---|---|---|
| 6,125,034 | A * | 9/2000 | Bovio | G06F 1/1616 361/679.32 |
| 6,132,019 | A * | 10/2000 | Kim | G06F 1/181 312/223.2 |
| 6,388,880 | B1 * | 5/2002 | El-Ghobashy | H05K 7/20172 165/104.33 |
| 6,600,656 | B1 * | 7/2003 | Mori | H05K 7/1421 174/168 |
| 6,972,949 | B1 | 12/2005 | Helgenberg et al. | |
| 2002/0027771 | A1 * | 3/2002 | Dong | G06F 1/181 361/679.33 |
| 2003/0011982 | A1 * | 1/2003 | Wooden | G06F 1/187 361/679.58 |
| 2005/0116588 | A1 * | 6/2005 | Teng | G06F 1/181 312/223.2 |
| 2006/0023409 | A1 * | 2/2006 | Lev | G06F 1/1656 361/679.55 |
| 2006/0143583 | A1 | 6/2006 | Diab et al. | |
| 2006/0245159 | A1 * | 11/2006 | Lin | G06F 1/181 361/679.39 |
| 2006/0266746 | A1 * | 11/2006 | Wang | H01R 9/2416 220/3.2 |
| 2007/0008706 | A1 * | 1/2007 | Lai | H05K 5/0004 361/796 |
| 2007/0086306 | A1 * | 4/2007 | Ip | G06F 1/181 369/99 |
| 2007/0258204 | A1 * | 11/2007 | Chang | G06F 1/1616 361/679.4 |
| 2008/0151508 | A1 * | 6/2008 | Chen | G06F 1/181 361/724 |
| 2009/0161322 | A1 * | 6/2009 | Hughes | H05K 5/0247 361/724 |
| 2011/0051355 | A1 * | 3/2011 | Hsiao | G06F 1/187 361/679.37 |
| 2011/0176272 | A1 * | 7/2011 | Hsiao | G06F 1/187 361/679.37 |
| 2011/0317390 | A1 * | 12/2011 | Moser | G01D 11/245 361/807 |
| 2012/0189261 | A1 * | 7/2012 | Denter | G02B 6/4261 385/135 |
| 2013/0161277 | A1 * | 6/2013 | Augsburger | H05K 7/1487 211/175 |

FOREIGN PATENT DOCUMENTS

| | | |
|---|---|---|
| CN | 201489426 U | 5/2010 |
| CN | 201726192 U | 1/2011 |

OTHER PUBLICATIONS

Supplementry Partial European Search Report Corresponding to International Application No. EP 13 85 9047; dated Nov. 16, 2016; 6 Pages.

European Search Report; corresponding EP App. No. 13859047; dated Feb. 9, 2017, 12 pages.

* cited by examiner

CHASSIS USED FOR AN ELECTRONIC DEVICE

RELATED APPLICATIONS

The present application is a 35 U.S.C. §371 national phase application of PCT International Application No. PCT/CN2013/087263, having an international filing date of Nov. 15, 2013, claiming priority to Chinese Patent Application No. 201210505184.8, filed Nov. 12, 2012. The disclosures of each application are incorporated herein by reference in their entireties. The above PCT International Application was published in the Chinese language as International Publication No. WO 2014/082531

FIELD OF THE INVENTION

The present invention generally relates to a chassis used for an electronic device and, more particularly, to a chassis for applying optional SNMP accessories into a UPS for realizing a SNMP function conveniently.

BACKGROUND OF THE INVENTION

UPS (Uninterruptible Power System) is an important peripheral device capable of providing continuous, stable and uninterruptible power supply, and has been widely used in computer devices, business terminals, network devices, network servers, data storage devices, business support platforms and even the whole communication network. At present, a highly available power system usually includes four parts: 1) a highly available electrical architecture, 2) a highly available, redundant UPS system, 3) a power management system and its integration with an enterprise information management system and 4) protection measures for long time electric supply failure. Therefore, it is very important to manage the UPS in order to ensure the high availability of the power system. The management of the UPS can be implemented by establishing an effective UPS monitoring system. An existing popular approach is to integrate the management of the UPS with the management of the network, that is, to add the USP into the network as a network node by utilizing an SNMP (Simple Network Management Protocol) card. On the one hand, the device can monitor its own state during run time, making it possible to perform preprocessing for some faults. On the other hand, users can monitor the running state of the UPS in real time at each node of the network and take effective countermeasures.

A UPS monitoring system mainly includes an intelligent UPS, an SNMP card and a power monitoring software. The intelligent UPS can communicate UPS parameter states with external communication terminals through standard communication ports according to the particular data communication protocols. As a network management agent of the UPS, the SNMP card can get some information related to the running state, the device characteristics and the system configuration of the UPS to which it belongs. The power monitoring software is used to cooperate with the UPS for learning the working state of the UPS.

Figure 1A:
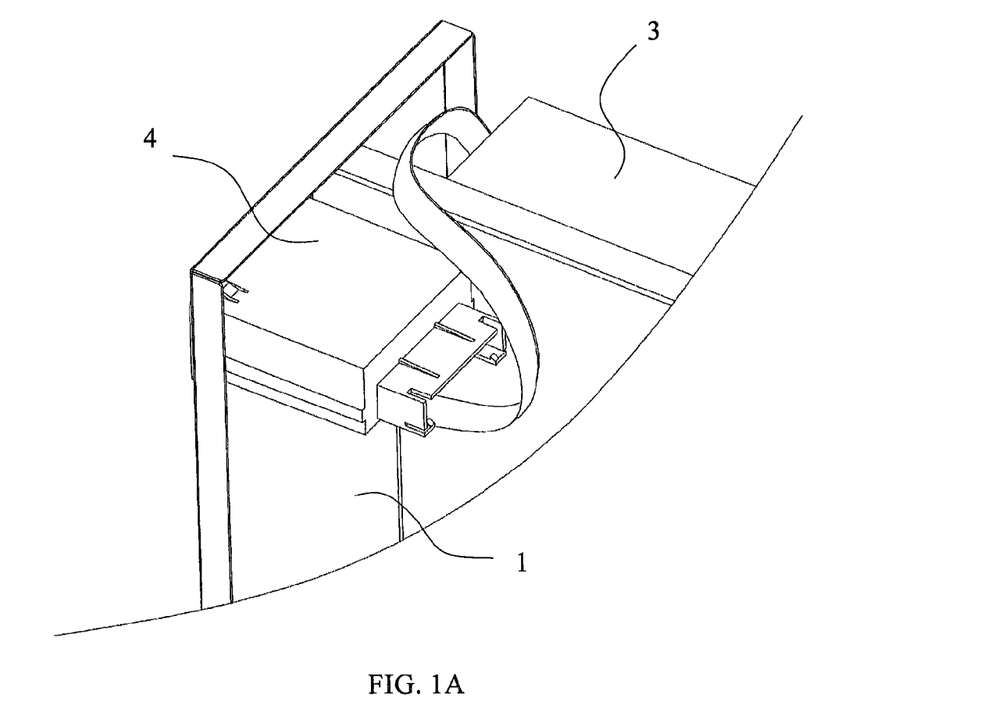
FIG. 1A partially illustrates an internal perspective view of a standard UPS with an SNMP function.
Figure 1B:
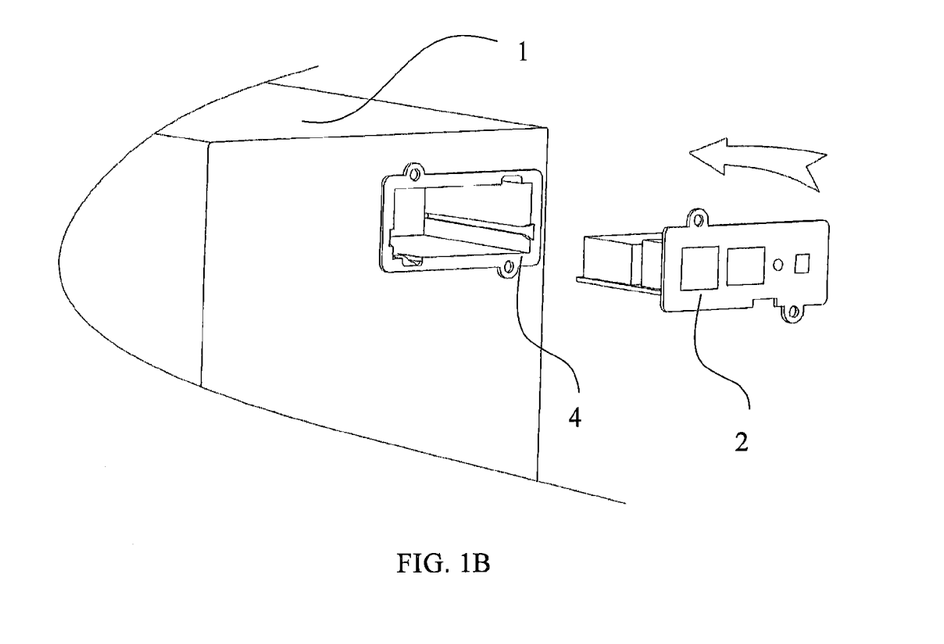
FIG. 1B partially illustrates a back view of a standard UPS with an SNMP function and illustrates an SNMP card.

An existing standard UPS with an SNMP function is partially shown in FIGS. 1A and 1B. To install an SNMP card 2, a space within a UPS chassis 1 should be reserved for an SNMP card box/card slot 4 for accommodating the SNMP card 2. However, because the SNMP card 2 is only an optional accessory of the UPS, the prepared SNMP card box 4 within the UPS chassis 1 undoubtedly results in a waste of manufacture cost for the UPS chassis that does not require an SNMP function. In addition, because an SNMP power controller/control board is integrated into the UPS PCBA (Printed Circuit Board Assembly) 3, the integration of the unused SNMP power controller into the PCBA, to a certain extent, causes a waste of manufacture cost for the UPS that does not require an SNMP function.

BRIEF SUMMARY OF THE INVENTION

In order to solve the problems of the existing technology mentioned above, the present invention provides a chassis for electronic device including:

a main body suitable for internally accommodating electronic device, wherein the mail body has an opening on at least one of its sides for accommodating the optional accessories of the electronic device; and a panel for enclosing the opening when closed and exposing the opening when opened;

wherein the panel is adapted to be connected with a cable, the first end of which is suitable for being electrically connected to the electronic device and the second end of which is suitable for being electrically connected to the optional accessories, and the panel maintains the cable within the main body when closed, and exposes the second end of the cable when opened.

In an embodiment, the panel is provided with two holes, and a cable tie passes through both holes in sequence to tie the cable onto the panel.

In an embodiment, the panel is removable. In other embodiments, an edge of the panel is connected with the main body by a pivot, or the panel is connected with the main body in a snap-fit relationship.

In an embodiment, the second end of the cable is provided with a connector for being electrically connected to the optional accessories.

In an embodiment, chassis further comprises a fixing device suitable to fix the optional accessories which have been inserted into the opening within the main body.

The present invention also provides a UPS arranged inside the chassis for electronic device discussed herein.

In addition, the present invention also provides a set of SNMP optional accessories suitable for the UPS discussed herein. The SNMP optional accessories comprises an SNMP card and an SNMP power controller, wherein the second end of the cable is suitable to be electrically connected to the SNMP card and the SNMP power controller.

After investigation, the inventors found that there are only about 10% of the UPS users using the SNMP function in operation. Thus, compared to the existing standard UPS with the SNMP function, the present invention has the following advantages:

1) There is no need to pre-assemble the SNMP card box that is used as an optional accessory of the UPS in the chassis, thereby reducing the production cost of the UPS;
2) It is unnecessary to integrate the SNMP power controller into the UPS PCBA in advance, thereby further reducing the production cost of the UPS.

DETAILED DESCRIPTION OF THE INVENTION

The present invention will be illustrated below in conjunction with the drawings and the specific embodiments.

Figure 2A:
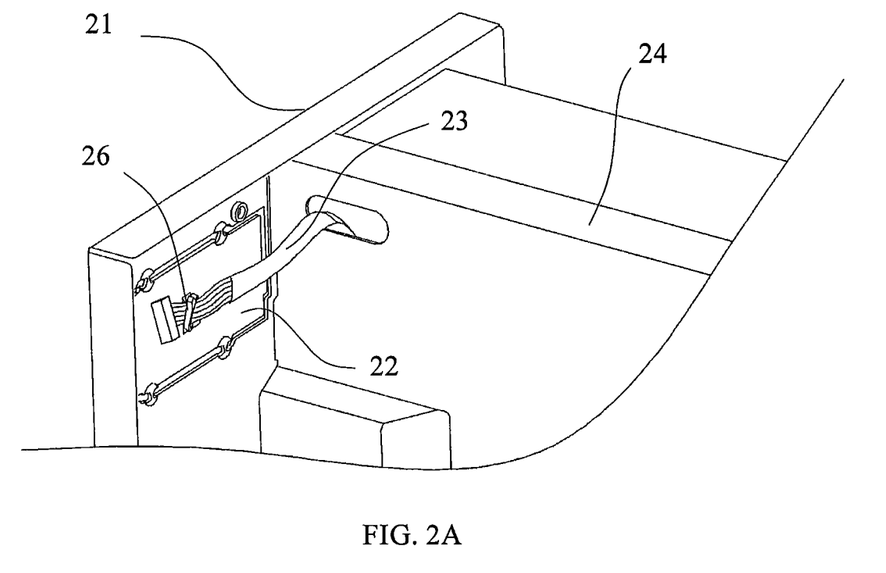
FIG. 2A partially illustrates an internal perspective view of a chassis for electronic device according to an embodiment of the present invention.

According to an embodiment of the present invention, a chassis for electronic device is provided, as shown in FIG. 2A, which includes a main body 21 and a panel 22 suitable for being connected with a cable 23.

The main body 21 can be any kind of chassis body suitable for accommodating an electronic device therein, and has an opening on at least one of its sides for accommodating the optional accessories of the electronic device.

The panel 22 is used to enclose the opening when closed and expose the opening when opened.

Figure 2B:
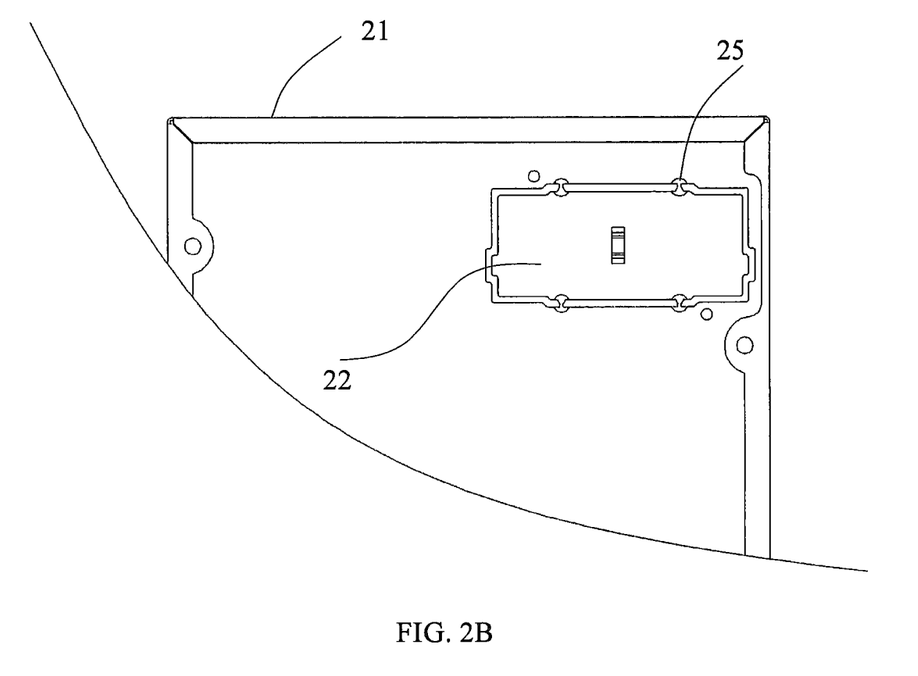
FIG. 2B partially illustrates a back view of a chassis for electronic device according to an embodiment of the present invention.

According to an embodiment of the present invention, the panel 22 is removable. FIG. 2B illustrates an example of the panel 22 and the main body 21, both of which are formed integrally during the manufacture of the chassis. Gaps are formed between the panel 22 and the main body 21 with one or more (four shown in FIG. 2B) fragile joints 25 between them. The panel 22 can be removed by destroying the one or more joints 25 with a slotted screwdriver and prying the panel 22 apart. In another case, the panel 22 can be fixed to the main body 21 by screws or rivets. Before installing the optional accessories, the screws can be removed and then the panel 22 can be removed.

In another embodiment, an edge of the panel 22 can be connected with the main body 21 by a pivot. The panel 22 can be rotated around the pivot towards the outside of the main body 21, so as to form an opening in the main body 21 without removing the panel 22. The benefit of this arrangement is that the panel 22 can be rotated around the pivot to enclose the main body 21 again if there is no need to reuse the optional accessories and the optional accessories have been removed. In another embodiment, the panel 22 is connected with the main body 21 in a snap-fit relationship, instead of using bolts.

The panel 22 is also connected with a cable (or an electric cable) 23. As shown in FIG. 2A, the first end of the cable 23 is suitable to be electrically connected to the electronic device (not shown) accommodated in the chassis, and the second end of the cable 23 is suitable to be electrically connected to one or more optional accessories of the electronic device. The panel 22 can maintain the cable 23 within the main body 21 when closed and expose the second end of the cable 23 when opened. The second end of the cable 23 can be provided with a connector for being electrically connected to the optional accessories. When installing the optional accessories into a traditional chassis, tools are required to open the whole chassis since the area of the opening in the main body of the traditional chassis for accommodating the optional accessories is typically small and the required cable cannot be easily taken out of the chassis through the opening. The present invention provides a way of taking out the cable while opening the panel, which makes it easier to complete the installation of the optional accessories without opening the whole chassis.

Various connection methods can be used for connecting the second end of the cable 23 to the panel 22. According to an embodiment of the present invention, the panel 22 can be provided with two through holes (a ribbon, such as a cable tie, a zip tie, a tether, etc. can pass through both holes). A cable tie 26 (shown in FIG. 2A) can pass through the two holes in sequence to tie the cable 23 onto the inner side of the panel 22 which forms part of the inner wall of the chassis when the panel 22 is closed. In a further embodiment, a portion of the panel between the two holes protrudes from its inner side, forming a handle that can facilitate the cable tie 26 passing through the two holes.

In another embodiment, in which the optional accessories are required to be electrically connected to multiple cables 23, a panel 22 with more than two holes can be used to fasten a plurality of different cables 23 without affecting the robustness of the panel 22. In other embodiments, if the size of each of the holes is large enough, the same two holes can be used in fastening the plurality of different cables 23 with different cable ties 26.

Figure 2C:
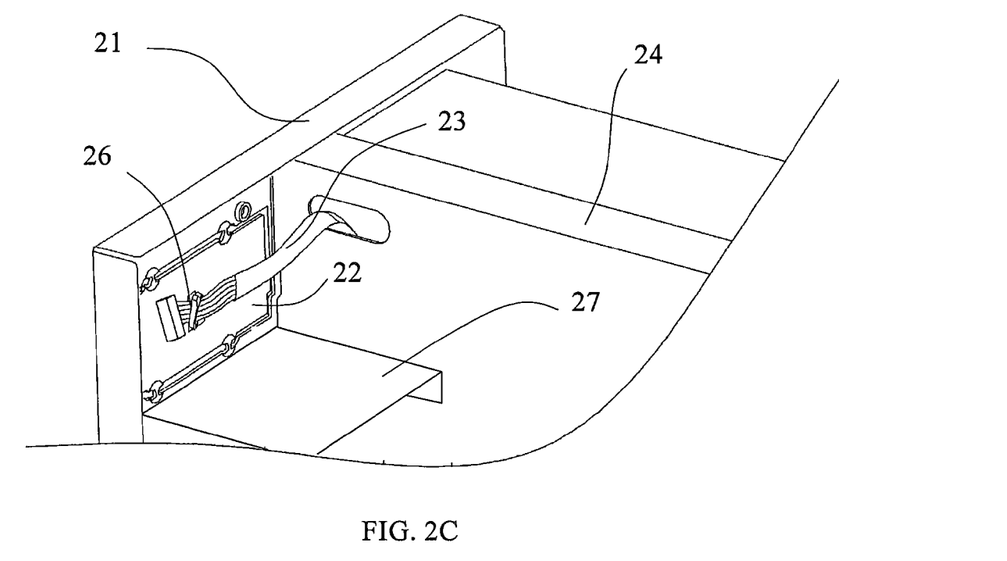
FIG. 2C partially illustrates an internal perspective view of a chassis for electronic device according to another embodiment of the present invention.

In an embodiment of the present invention, a fixing device for providing fixing or supporting function is also included in the main body 21 of the chassis, such as a bracket, a slot, a support plate, etc. In the embodiment shown in FIG. 2C, the fixing device can be a bracket 27 protruding from a partition 24 and the bracket 27 is perpendicular to the partition 24 and suitable to support the optional accessories of the electronic device.

According to an embodiment of the present invention, a UPS arranged inside the chassis discussed above is provided.

According to an embodiment of the present invention, a set of SNMP optional accessories suitable for the UPS discussed above are provided. The SNMP optional accessories include an SNMP card and an SNMP power controller connected with the SNMP card via SNMP communication lines. In addition, the second end of the cable connected to the panel of the UPS can be electrically connected to the optional accessories.

Figure 3A:
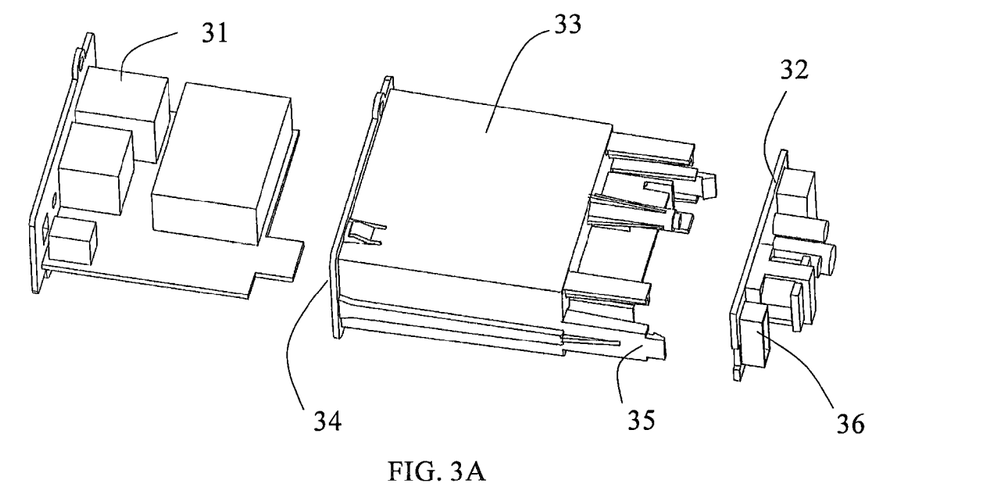
FIG. 3A is an exploded view of SNMP optional accessories according to an embodiment of the present invention.
Figure 3B:
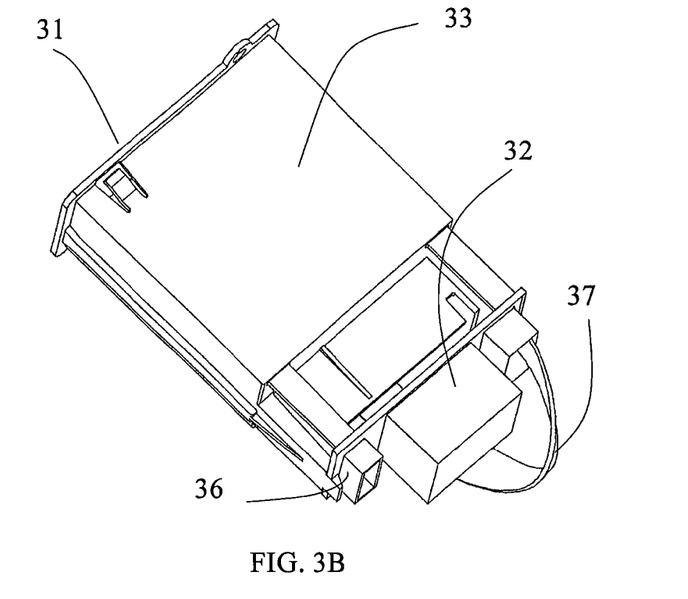
FIG. 3B is a stereogram of SNMP optional accessories according to an embodiment of the present invention.

FIG. 3A illustrates the components of the SNMP optional accessories according to an embodiment of the present invention. The SNMP card 31 and the SNMP power controller 32 can be fixed into a container, such as an SNMP card box/card slot 33. The SNMP optional accessories shown in FIG. 3A is an integration of the SNMP card 31, the SNMP power controller 32 and the SNMP card box 33, which together form the optional accessories of the UPS. The SNMP card 31 can be inserted from the first side 34 of the SNMP card box 33 and fixed into the SNMP card box 33. The SNMP power controller 32, which has a slot 36, can be fixed onto the second side 35 of the SNMP card box 33. The assembled SNMP optional accessories are shown in FIG. 3B, wherein the SNMP card 31 is electrically connected with the SNMP power controller 32 via the SNMP communication line 37. The SNMP optional accessories are suitable to be inserted into the opening of the UPS chassis and to expose the external port or interface of the SNMP card 31 after the installation of the SNMP optional accessories.

In another embodiment, there is no need to fix the SNMP card 31 into the SNMP card box 33, that is, the SNMP card 31 and the SNMP card box 33 are separable. When installing the optional accessories, the SNMP card box 33 is fixed with the SNMP power controller 32 first, then, the SNMP card 31 is inserted into the SNMP card box 33 so as to complete the installation.

As mentioned before, a portion of the main body close to the panel can be provided with screw holes which are mated to the screws or bolts. In an embodiment, the SNMP optional accessories are provided with holes (e.g. screw holes) corresponding to the location of the screw holes in the main body. After installing the SNMP optional accessories into the UPS chassis, the screws can be used to pass through the holes in the SNMP optional accessories and the screw holes in the main body of the UPS, so as to fix the SNMP optional accessories onto the main body of the UPS.

Figure 4A:
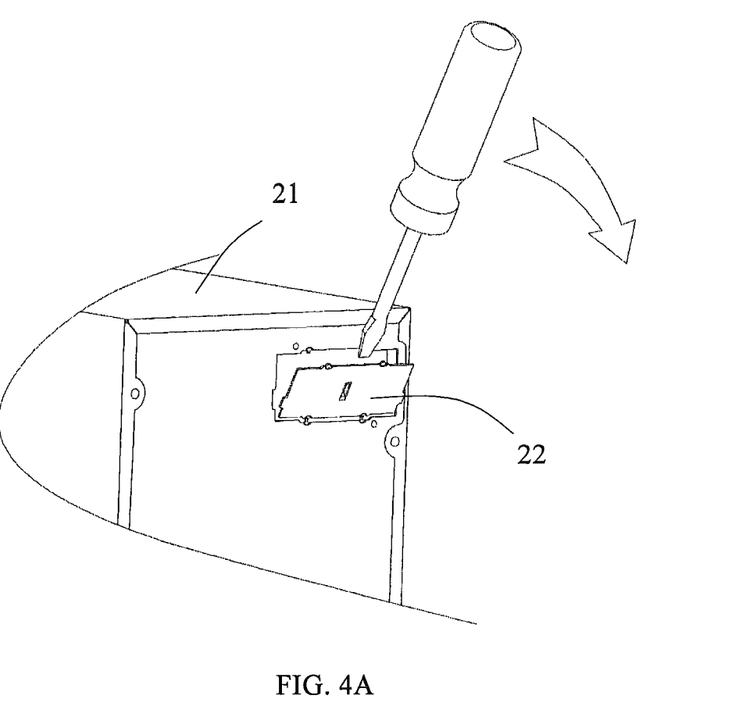
FIG. 4A-FIG. 4D are diagrams of a method for installing the SNMP optional accessories into a UPS according to an embodiment of the present invention.
Figure 4B:
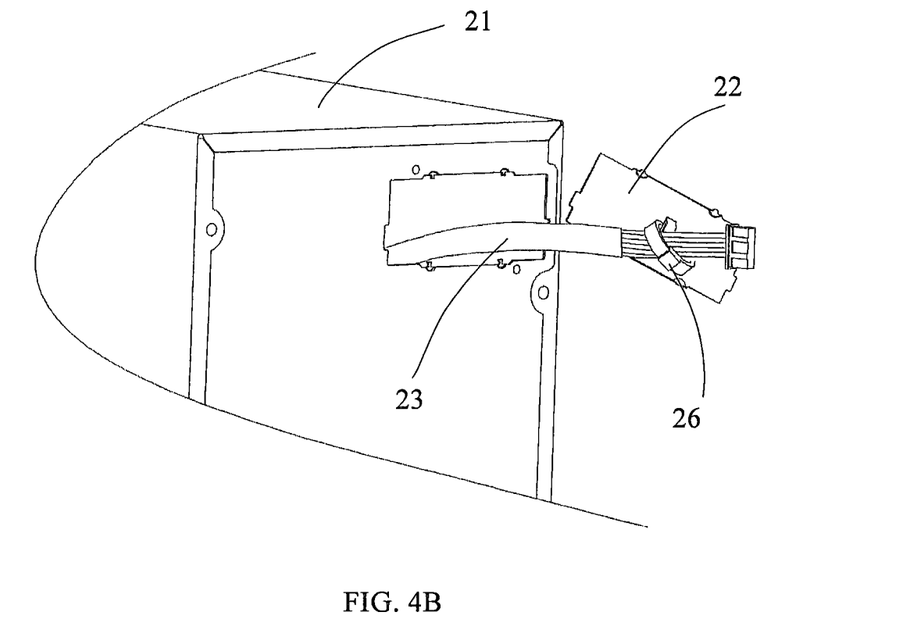
Figure 4C:
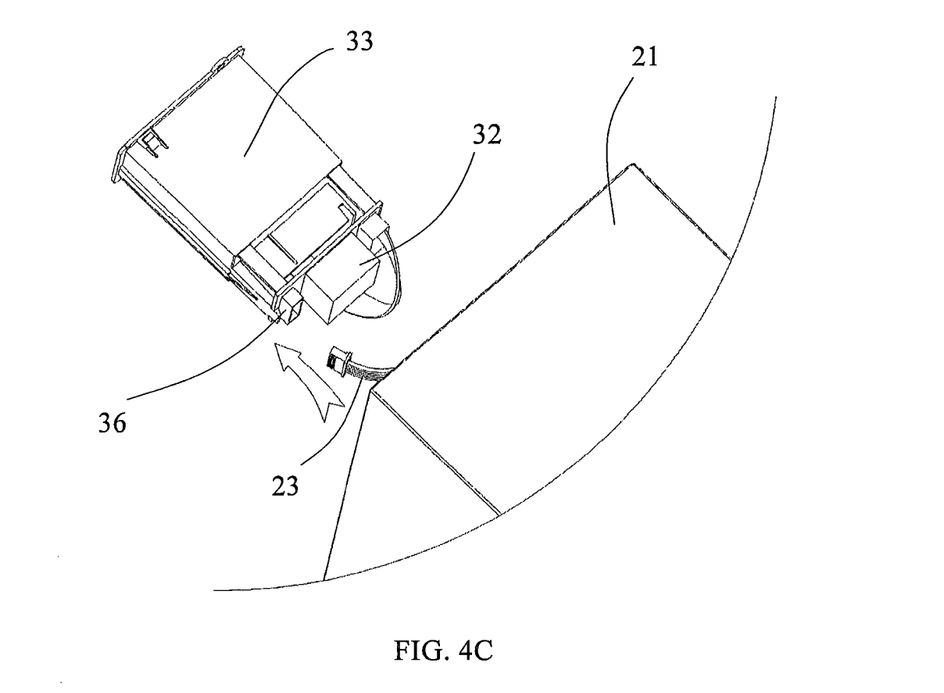
Figure 4D:
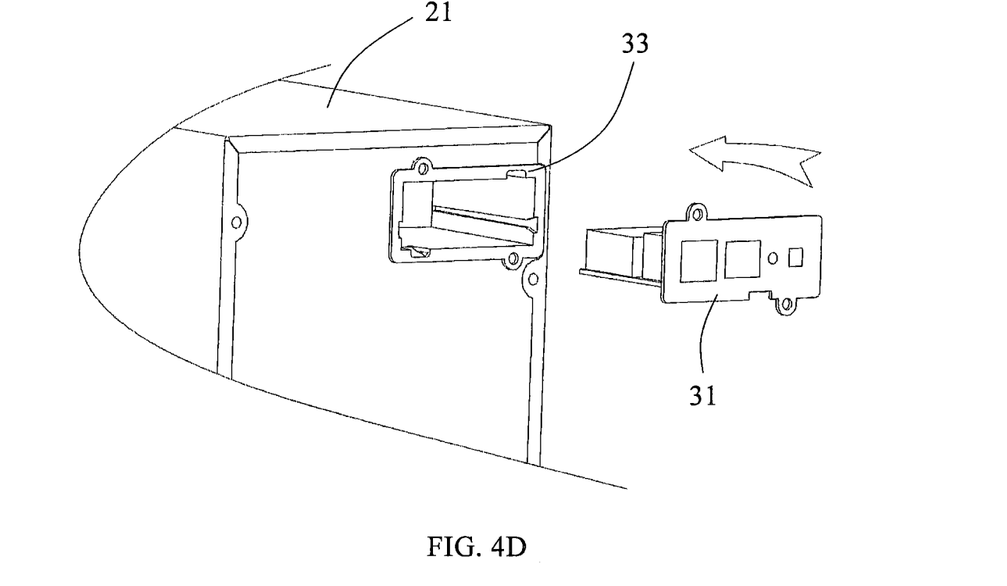

According to an embodiment of the present invention, a method for installing the SNMP optional accessories into a UPS chassis is provided, which is illustrated from FIG. 4A to 4D, wherein the panel 22 and the main body 21 of the UPS chassis are formed integrally, the SNMP card 31 and the SNMP card box 33 are separable and the SNMP power controller 32 and the SNMP card box 33 are fixed together. The method comprises the following steps:

Step one: pry the panel 22 apart with a slotted screwdriver to form an opening in the main body 21, as shown in FIG. 4A;

Step two: untie the cable tie 26 for connecting the panel 22 with the cable 23 (as shown in FIG. 4B) and pull the connector of the cable 23 out;

Step three: plug the connector of the cable 23 into the slot 36 of the SNMP power controller 32 (as shown in FIG. 4C) and insert the SNMP power controller 32 and the SNMP card box 33 into the main body 21 through the opening therein;

Step four: insert the SNMP card 31 into the SNMP card box 33 (as shown in FIG. 4D).

Figure 5A:
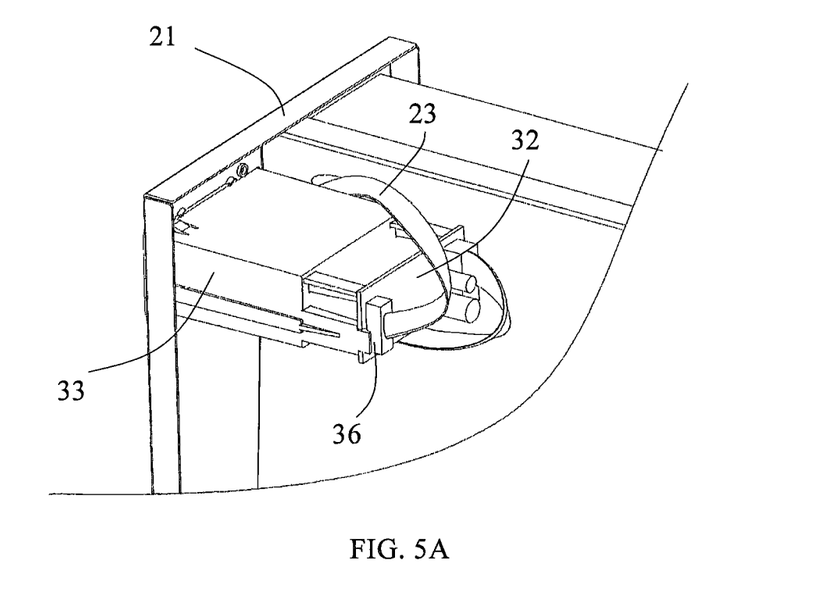
FIG. 5A and FIG. 5B partially illustrate an internal perspective view and a back view of a UPS with the SNMP optional accessories installed respectively according to an embodiment of the present invention.
Figure 5B:
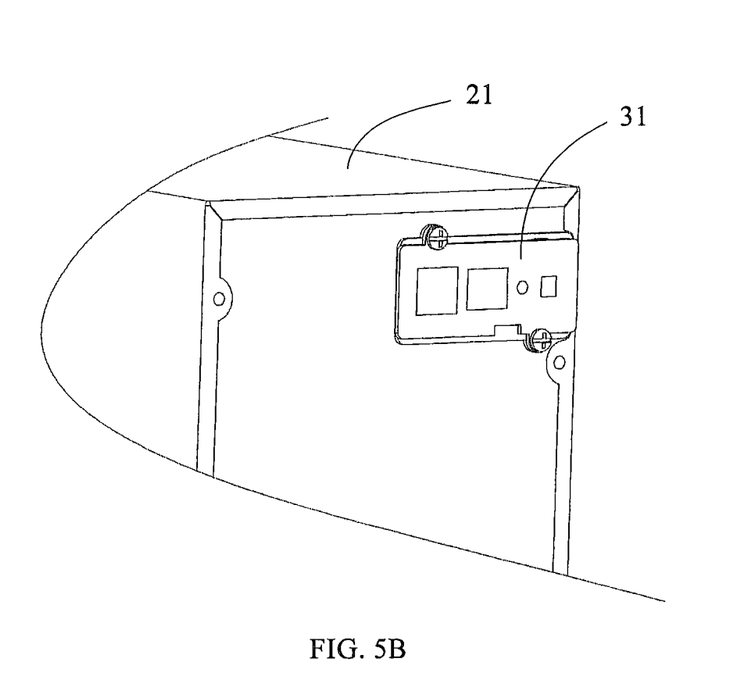

A perspective view and a back view of the UPS chassis after installation are shown in FIGS. 5A and 5B.

In an embodiment, in which a portion of the main body close to the panel is provided with screw holes and the SNMP optional accessories are also provided with holes corresponding to the screw holes in the main body, the method further comprises:

Step five: fix the SNMP card into the UPS chassis with screws.

In another embodiment, in which the SNMP card has been already fixed into the SNMP card box, the third step of the installation process can be replaced with the follows:

plug the connector of the cable into the slot of the SNMP optional accessories and insert the SNMP optional accessories into the main body through the opening therein. Then, skip Step four.

It should be noted and understood that various modifications and changes can be made to the present invention described in detail above without departing from the spirit and scope of the invention required by the following claims. Therefore, the claimed scope of the technical solutions should not be limited by any specific exemplary embodiments provided in the specification.

What is claimed is:

1. A chassis used for an electronic device, the chassis comprising:

a main body configured to accommodate the electronic device, wherein the main body has an opening on at least one of its sides configured to accommodate an optional accessory for the electronic device; and a panel configured to conceal the opening in a first orientation and to be moved to a second orientation that exposes the opening for installation of the optional accessory through the opening; and a cable having a first end electrically connected to the electronic device and a second end mechanically attached to the panel and configured to be electrically connected to the optional accessory, wherein the panel is configured for attachment of the cable thereto when the optional accessory is not installed such that the second end of the cable is retained within the main body when the panel is in the first orientation and the second end of the cable moves from an interior of the main body to outside the main body through the opening and the first end remains electrically connected to the electronic device when the panel is moved from the first orientation to the second orientation, wherein the panel has two holes therein, and further comprising a cable tie passing through both holes in sequence to tie the cable onto the panel, and wherein the panel is fastened to the main body in the first orientation and removed from the main body in the second orientation.

2. The chassis of claim 1, wherein the panel is configured to pivot at an edge of the panel to expose the opening in the second orientation.

3. The chassis of claim 1, wherein the panel is connected to the main body in a snap-fit relationship.

4. The chassis of claim 1, further comprising a connector coupled to the second end of the cable and configured to releasably connect to the optional accessory.

5. The chassis of claim 1, further comprising a bracket configured to support the optional accessory within the main body when the optional accessory is inserted through the opening.

6. The chassis of claim 1 wherein the electronic device comprises a UPS.

7. The chassis of claim 6 wherein the optional accessory comprises an SNMP card or an SNMP power controller.

8. An apparatus comprising:

a chassis supporting a UPS and having opening therein configured to accept an accessory for the UPS and a panel configured to conceal the opening in a first orientation and movable to a second orientation to expose the opening and allow installation of the accessory; and a cable having a first end electrically coupled to the UPS and a second end configured to be coupled to the accessory, wherein the panel is configured for attachment of the cable thereto when the accessory is not installed such that the second end of the cable is retained within the chassis when the panel is in the first orientation and moves outside of the chassis through the opening while the first end remains electrically connected to the UPS within the chassis when the panel is moved to the second orientation, wherein the panel has two holes therein, and further comprising a cable tie passing through both holes in sequence to tie the cable onto the panel, and wherein the panel is fastened to the chassis in the first orientation and removed from the chassis in the second orientation.

9. The apparatus of claim 8 further comprising a connector at the second end of the cable and configured to releasably electrically connect to the accessory.

10. The apparatus of claim 8 wherein the panel is configured to pivot to expose the opening.

11. The apparatus of claim 8 wherein the panel is configured to be snap fit attached to the chassis.

12. The apparatus of claim 8 wherein the accessory comprises an SNMP card or an SNMP power controller.

* * * * *